United States Patent
Glaser et al.

(10) Patent No.: US 9,793,708 B1
(45) Date of Patent: Oct. 17, 2017

(54) OVERVOLTAGE PROTECTION CIRCUITS AND METHODS OF OPERATING SAME

(71) Applicant: Integrated Device Technology, Inc., San Jose, CA (US)

(72) Inventors: Alan Wolfram Glaser, Suwanee, GA (US); Tak Kwong Wong, Milpitas, CA (US); Al Fang, Suwanee, GA (US); Roland Thomas Knaack, Suwanee, GA (US); Jon Roderick Williamson, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 518 days.

(21) Appl. No.: 14/576,288

(22) Filed: Dec. 19, 2014

Related U.S. Application Data

(60) Provisional application No. 62/040,798, filed on Aug. 22, 2014, provisional application No. 62/023,712, filed on Jul. 11, 2014.

(51) Int. Cl.
*H02H 9/00* (2006.01)
*H02H 9/04* (2006.01)

(52) U.S. Cl.
CPC ............ *H02H 9/042* (2013.01); *H02H 9/046* (2013.01)

(58) Field of Classification Search
CPC .................................................... H02H 9/042
USPC ......................................................... 361/91.5
See application file for complete search history.

(56) References Cited

U.S. PATENT DOCUMENTS

| | | | |
|---|---|---|---|
| 5,053,643 A * | 10/1991 | Tanaka | H03K 19/00307 326/26 |
| 5,534,795 A | 7/1996 | Wert et al. | |
| 5,917,220 A | 6/1999 | Waggoner | |
| 5,929,667 A * | 7/1999 | Abadeer | H03K 19/00315 326/83 |
| 6,728,084 B2 | 4/2004 | Ziemer et al. | |
| 6,798,629 B1 | 9/2004 | Proebsting | |
| 7,813,092 B2 * | 10/2010 | Ma | H01L 27/0255 361/111 |
| 8,559,147 B1 | 10/2013 | Quaife | |

(Continued)

OTHER PUBLICATIONS

Data Sheet, NCP346, ON Semiconductor® (http://onsemi.com), Sep. 2006, Rev. 6, © Semiconductor Components Industries, LLC, 2006, 15 pages.

*Primary Examiner* — Stephen W Jackson
(74) *Attorney, Agent, or Firm* — Myers Bigel, P.A.

(57) ABSTRACT

Overvoltage protection circuits include a combination of an overvoltage detection circuit and a voltage clamping circuit that inhibits sustained overvoltage conditions. An overvoltage detection circuit can include first and second terminals electrically coupled to first and second power supply signal lines, respectively. This overvoltage detection circuit may be configured to generate a clamp activation signal (CAS) in response to detecting an excessive overvoltage between the first and second power supply signal lines. This CAS is provided to an input of the voltage clamping circuit, which is electrically coupled to the first power supply signal line and configured to sink current from the first power supply signal line in response to the CAS. The voltage clamping circuit may be configured to turn on and sink current from the first power supply signal line in-sync with a transition of the CAS from a first logic state to a second logic state.

18 Claims, 5 Drawing Sheets

(56) References Cited

U.S. PATENT DOCUMENTS 8,582,261 B2 * 11/2013 Salcedo ............... H02H 9/046
                                                    361/111
8,766,675 B1    7/2014 Dreps et al.

* cited by examiner

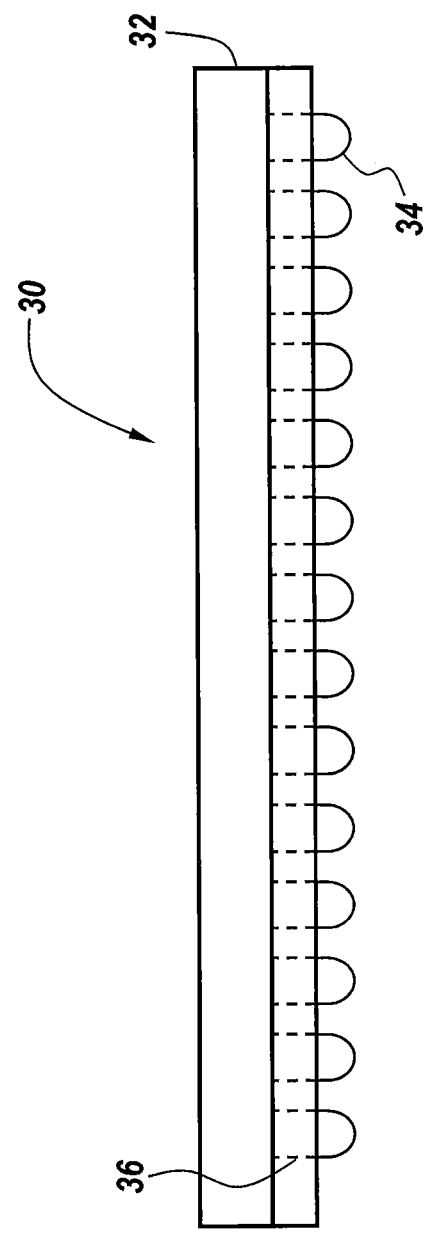

OVERVOLTAGE PROTECTION CIRCUITS AND METHODS OF OPERATING SAME

REFERENCE TO PRIORITY APPLICATIONS

This application claims priority to U.S. Provisional Application Ser. No. 62/040,798, filed Aug. 22, 2014 and U.S. Provisional Application Ser. No. 62/023,712, filed Jul. 11, 2014, the disclosures of which are hereby incorporated herein by reference in their entirety.

FIELD OF THE INVENTION

The present invention relates to integrated circuit devices and, more particularly, to integrated circuit devices that are susceptible to temporary overvoltage stress.

BACKGROUND OF THE INVENTION

Certain circuit applications require an integrated circuit to be temporarily exposed to voltages significantly higher than a specified absolute maximum voltage rating for a respective technology. This can result in short term failures due to device rating limitations, as well as long term reliability degradation. In some applications, a supply voltage can exceed its nominal value by four to eight times. Some techniques to provide overvoltage protection include incorporating relatively complex level shifting circuits to regulate a power supply voltage at an acceptable level. Another technique is disclosed in U.S. Pat. No. 8,582,261 to Salcedo et al., entitled "Apparatus and Method for Electronic Circuit Protection." This technique uses an actively-controlled protection circuit containing a detector, a timer, a current source and a latch. Another conventional protection circuit is disclosed in U.S. Pat. No. 6,728,084 to Ziemer et al., entitled "System and Method for Overvoltage Protection of an Integrated Circuit." In this circuit, an overvoltage condition signal is generated in response to an overvoltage condition. This signal drives one or more variable resistance devices (e.g., power devices), which perform a voltage limiting function. An overvoltage protection integrated circuit is also disclosed in a datasheet for product NCP346 by ON Semiconductor® (http://onsemi.com), September, 2006 (Rev. 6). This overvoltage protection circuit (OVP) protects sensitive electronic circuitry from overvoltage transients and power supply faults when used in conjunction with an external P-channel FET. In particular, the OVP circuit is designed to sense an overvoltage condition and quickly disconnect the input voltage supply from a load before any damage can occur.

SUMMARY OF THE INVENTION

Overvoltage protection circuits according to embodiments of the invention include a combination of an overvoltage detection circuit and a voltage clamping circuit that inhibits sustained overvoltage conditions without requiring complex level shifter circuitry or power-off reset. According to some of these embodiments of the invention, an overvoltage detection circuit may include first and second terminals electrically coupled to first and second signal lines, respectively. This overvoltage detection circuit may also be configured to generate a clamp activation signal (CAS) in response to detecting an excessive overvoltage between the first and second signal lines. This clamp activation signal is provided to an input of the voltage clamping circuit, which is electrically coupled to the first signal line and configured to sink current from the first signal line in response to the clamp activation signal. In particular, the voltage clamping circuit may be configured to turn on and sink current from the first signal line in-sync with a transition of the clamp activation signal from a first logic state to a second logic state and turn off in-sync with a transition of the clamp activation signal from the second logic state to the first logic state.

According to further embodiments of the invention, the overvoltage detection circuit may be configured as a totem-pole arrangement of a plurality of serially-connected diodes and at least one resistor. In addition, an analog-to-digital level detector may be provided, which has an input electrically coupled to a node in the totem-pole arrangement of the plurality of serially-connected diodes and the at least one resistor and an output electrically coupled to the input of the voltage clamping circuit. In some embodiments of the invention, the analog-to-digital level detector may be provided as an inverter having an input terminal electrically connected to the at least one resistor. In some further embodiments of the invention, the input terminal of the inverter may also be electrically connected to a cathode of one of the plurality of serially-connected diodes. Moreover, to inhibit oscillation of the clamp activation signal, a capacitor may be provided within the overvoltage detection circuit. This capacitor may have a first terminal electrically connected to the input terminal of the inverter and possibly a second terminal electrically coupled to the second signal line. According to still further embodiments of the invention, a transient suppression resistor may be provided, which electrically couples the input of the voltage clamping circuit to the output of the overvoltage detection circuit.

In some further embodiments of the invention, an integrated circuit device is provided with an integrated circuit substrate (e.g., semiconductor substrate) and an overvoltage protection circuit on the integrated circuit substrate. This overvoltage protection circuit can include: (i) an overvoltage detection circuit, which is configured to generate a clamp activation signal in response to detecting an excessive overvoltage between first and second signal lines (e.g., Vdd and Vss); and (ii) a voltage clamping circuit, which is electrically coupled to an output of the overvoltage detection circuit and the first signal line. This voltage clamping circuit is configured to sink a possibly high current from the first signal line (and cause a protective sag in its voltage), in-sync with a transition of the clamp activation signal from a first logic state to a second logic state. According to some of these embodiments of the invention, the voltage clamping circuit includes a plurality of voltage clamping sub-circuits, which are preferably uniformly distributed across the integrated circuit substrate and possibly responsive to the same clamp activation signal. Each of the plurality of voltage clamping sub-circuits may include a respective MOS transistor having a first current carrying terminal electrically coupled to the first signal line. More specifically, each of the plurality of voltage clamping sub-circuits may include a respective inverter having an input terminal responsive to the clamp activation signal and an output terminal electrically coupled to a gate terminal of a corresponding MOS transistor. This electrical coupling of the output terminal of the inverter to the gate terminal of a corresponding MOS transistor may be provided by a transient suppression resistor.

According to still further embodiments of the invention, a packaged integrated circuit device may be provided, which includes an integrated circuit substrate electrically coupled to a plurality of electrical conductors (e.g., pins, through-substrate vias (TSVs), etc.), which extend through an integrated circuit package surrounding the integrated circuit substrate. At least one overvoltage protection circuit is provided on the integrated circuit substrate, and within the integrated circuit package. This overvoltage protection circuit may include an overvoltage detection circuit having first and second terminals electrically coupled to first and second power supply conductors extending though the integrated circuit package, respectively. This overvoltage detection circuit may be configured to generate a clamp activation signal in response to detecting an excessive overvoltage between the first and second power supply conductors. The overvoltage protection circuit may also include a voltage clamping circuit, which is electrically coupled to an output of the overvoltage detection circuit and the first power supply conductor. This voltage clamping circuit may be configured to sink a relatively high total current (e.g., ~5 amps) from the first power supply conductor in-sync with a transition of the clamp activation signal from a first logic state to a second logic state. In some of these embodiments of the invention, the voltage clamping circuit includes a plurality of voltage clamping sub-circuits, which are distributed across the integrated circuit substrate and responsive to the same clamp activation signal. Moreover, each of the plurality of voltage clamping sub-circuits may include a respective MOS transistor having a first current carrying terminal (e.g., drain terminal) electrically coupled to the first power supply conductor and a second current carrying terminal (e.g., source terminal) electrically coupled to the second power supply conductor, and a respective inverter having an input terminal responsive to the clamp activation signal and an output terminal electrically coupled to a gate terminal of a corresponding MOS transistor. Based on this configuration, the overvoltage protection circuit can limit a maximum voltage seen across the power supply rails of an integrated circuit chip when an excessive voltage is applied to the power supply conductors of an integrated circuit package containing the chip.

BRIEF DESCRIPTION OF THE DRAWINGS

FIG. 3 is a cross-sectional view of a packaged integrated circuit device according to an embodiment of the present invention.

DETAILED DESCRIPTION OF EMBODIMENTS

Figure 1A:
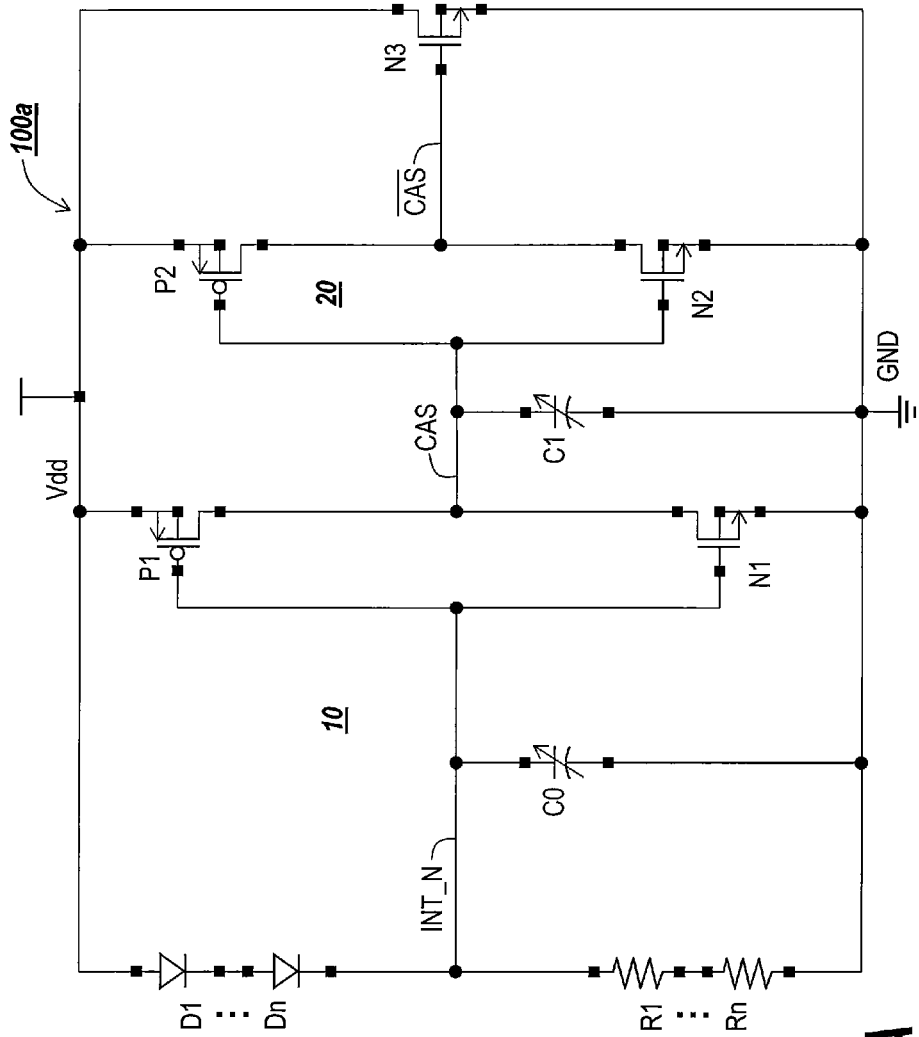
FIG. 1A is an electrical schematic of an overvoltage protection circuit according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1A, an overvoltage protection circuit 100a according to an embodiment of the present invention includes a combination of an overvoltage detection circuit 10 and a voltage clamping circuit 20, connected as illustrated. The overvoltage detection circuit 10 may include first and second terminals electrically coupled to first and second signal lines, respectively, which are illustrated as Vdd and GND (or Vss<0) power supply lines in one embodiment. The overvoltage detection circuit 10 is configured to generate a clamp activation signal (CAS) in response to detecting an excessive overvoltage between the first and second signal lines. This excessive overvoltage can be as high as 8 Volts for a 1.2 Volt nominal power supply voltage, for example. This clamp activation signal CAS is provided as an input to the voltage clamping circuit 20, which is electrically coupled to the first signal line (e.g., Vdd) and second signal line (e.g., GND) and configured to temporarily sink a potentially high "overvoltage current" (e.g., 5 amps) from the first signal line in response to the clamp activation signal CAS. In particular, the voltage clamping circuit 20 is configured to turn on and sink current from the first signal line (e.g., Vdd) in-sync with a transition of the clamp activation signal CAS from a first logic state (e.g., logic 1=Vdd) to a second logic state (e.g., logic 0=GND) and turn off in-sync with a transition of the clamp activation signal CAS from the second logic state to the first logic state.

As shown by FIG. 1A, an embodiment of the overvoltage detection circuit 10 includes a totem pole arrangement of at least one diode in series with at least one resistor. The at least one diode may be configured as a plurality of serially-connected diodes D1 through Dn and the at least one resistor may be configured as a plurality of serially-connected resistors R1 through Rn. A voltage at an intermediate node INT_N may be provided as an input signal to an inverter, which operates as an analog-to-digital level detector. This inverter (e.g., CMOS inverter) includes PMOS pull-up transistor P1 in series with an NMOS pull-down transistor N1. The "digital" clamp activation signal CAS is generated at the output of this inverter (P1, N1) and may have its transition timing tuned by a variable output capacitor C1 (optional). As will be understood by those skilled in the art, the set point of this level detector is a function of the number of diodes in the totem pole arrangement and the inverter sizing ratio (i.e., relative sizing of the MOS transistors P1 and N1). If the diode forward voltage equals $V_{fb}$, then forward current will begin to flow through the diodes D1 through Dn when the voltage across the first and second signal lines is greater than $nV_{fb}$.

A variable capacitor C0 (e.g., digitally-programmable NMOS capacitor) is also provided within the overvoltage detection circuit 10. This capacitor C0 operates to stabilize the voltage at the intermediate node INT_N and prevent any relatively high frequency transients on the first signal line (e.g., Vdd power supply line) from influencing the analog-to-digital level detection performed by the inverter (P1, N1). Although the intermediate node INT_N is illustrated as a point of direct electrical connection between a cathode of a lowermost one of the plurality of diodes D1 through Dn and a terminal of an uppermost one of the plurality of resistors R1 through Rn, this intermediate node may be provided at another node (e.g., diode-to-diode, resistor-to-resistor) of the totem pole arrangement according to other embodiments of the invention.

Referring still to FIG. 1A, the voltage clamping circuit 20 is illustrated as including an inverter, which is formed by PMOS pull-up transistor P2 and NMOS pull-down transistor N2, and a "rail-to-rail" NMOS pull-down transistor N3, which is illustrated as having a drain terminal directly connected to the first signal line (e.g., Vdd) and a source terminal directly connected to the second signal line (e.g., GND). This NMOS transistor N3, which includes a gate terminal connected to an output of the inverter (P2, N2), is turned on in-sync with a high-to-low transition of the clamp activation signal CAS, which causes a corresponding low-to-high voltage transition at the output of the inverter (P2, N2). In this manner, an excessive overvoltage transient at the first signal line (e.g., Vdd), which is sufficient to significantly pull-up a normally zero voltage at the intermediate node INT_N and thereby cause a high-to-low transition of the clamp activation signal CAS, will be suppressed by operation of the NMOS pull-down transistor(s) N3, which operates to sink potentially high current from the first signal line (e.g., Vdd) to the second signal line (e.g., GND).

Figure 1B:
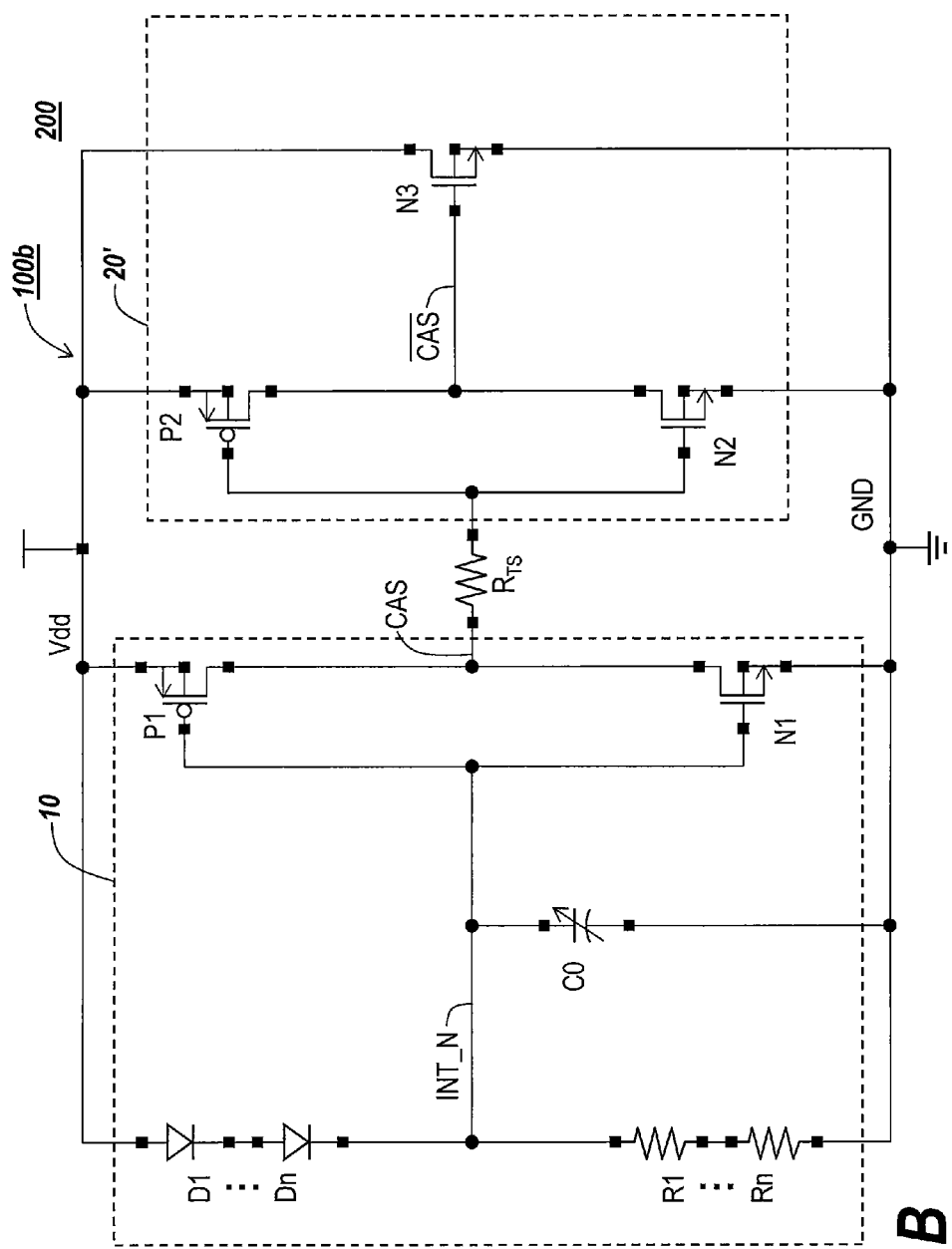
FIG. 1B is an electrical schematic of an integrated circuit substrate having an overvoltage protection circuit therein containing a distributed voltage clamping circuit, according to an embodiment of the present invention.

FIG. 1B illustrates an integrated circuit substrate 200 having an overvoltage protection circuit 100b therein containing an overvoltage detection circuit 10 and a voltage clamping circuit 20', which is electrically coupled by a transient suppression resistor $R_{TS}$ to an output of the overvoltage detection circuit 10, as illustrated. This voltage clamping circuit 20' is illustrated as including N=100 identical versions of the voltage clamping circuit 20 of FIG. 1A as sub-circuits, which may be uniformly distributed across the substrate 200 in order to provide N=100 parallel current paths when the voltage clamping circuit 20' is sinking current from the first signal line (e.g., Vdd). Preferably, these parallel current paths can be sufficiently separate from each other so that surrounding functional analog and/or digital logic circuits within the substrate 200 can be protected from excessive and potentially damaging overvoltage stress. Moreover, the transient suppression resistor $R_{TS}$, which typically may have a value in a range from about 10 ohms to about 2000 ohms, operates to inhibit rapid fluctuations in voltage on the first signal line (e.g., Vdd spikes) from repeatedly switching the plurality of NMOS pull-down transistors N3 on and off and thereby sustaining an underdamped feedback condition on the first signal line that can enable unwanted oscillations (e.g., power supply voltage swings). As will be understood by those skilled in the art, the actual value of the transient suppression resistor $R_{TS}$ may vary in alternative embodiments based on expected power supply ramp rates, transistor switching speeds, layout parasitic capacitances, etc.

Figure 1C:
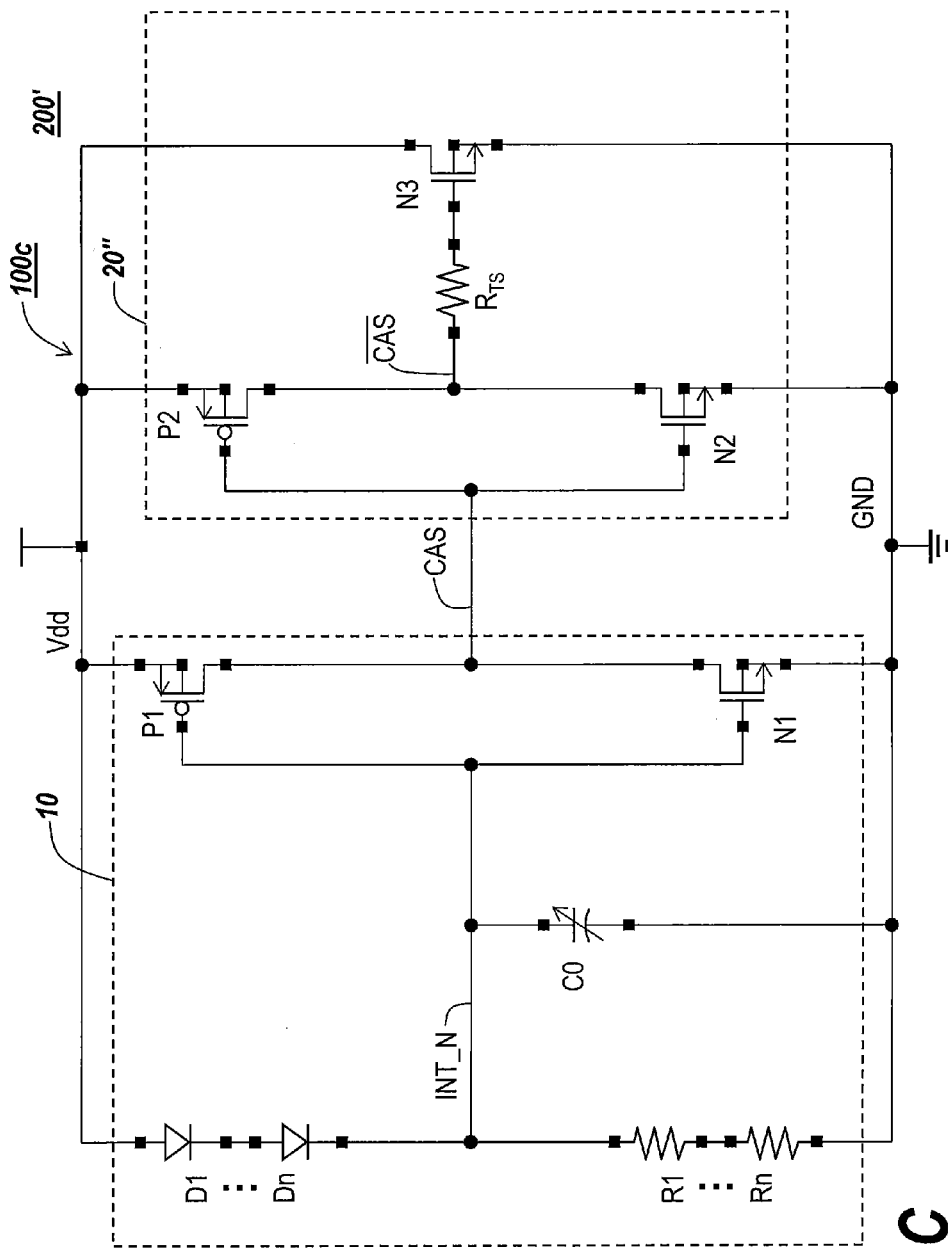
FIG. 1C is an electrical schematic of an integrated circuit substrate having an overvoltage protection circuit therein containing a distributed voltage clamping circuit, according to another embodiment of the present invention.

FIG. 1C illustrates an integrated circuit substrate 200' having an overvoltage protection circuit 100c therein containing an overvoltage detection circuit 10 and a voltage clamping circuit 20" interspersed among analog and/or digital logic circuits (not shown). This voltage clamping circuit 20" is illustrated as including N=100 identical versions of a modified voltage clamping circuit as sub-circuits, which are uniformly distributed across the substrate 200 in order to provide N=100 parallel current paths when the voltage clamping circuit 20" is sinking current from the first signal line (e.g., Vdd). In contrast to FIG. 1B, each of the voltage clamping sub-circuits includes an internal transient suppression resistor $R_{TS}$ extending between an output of a corresponding inverter (P2, N2) and a gate terminal of a corresponding rail-to-rail NMOS pull-down transistor N3, as illustrated. This transient suppression resistor $R_{TS}$, which typically may have a value in a range from about 1 ohm to about 10 ohms, operates to increase an RC time constant associated with the gate of the NMOS pull-down transistor N3 and thereby moderate its pull-down characteristics to inhibit any sustained underdamped feedback condition on the first signal line and any unwanted oscillations (e.g., power supply voltage swings).

Figure 2:
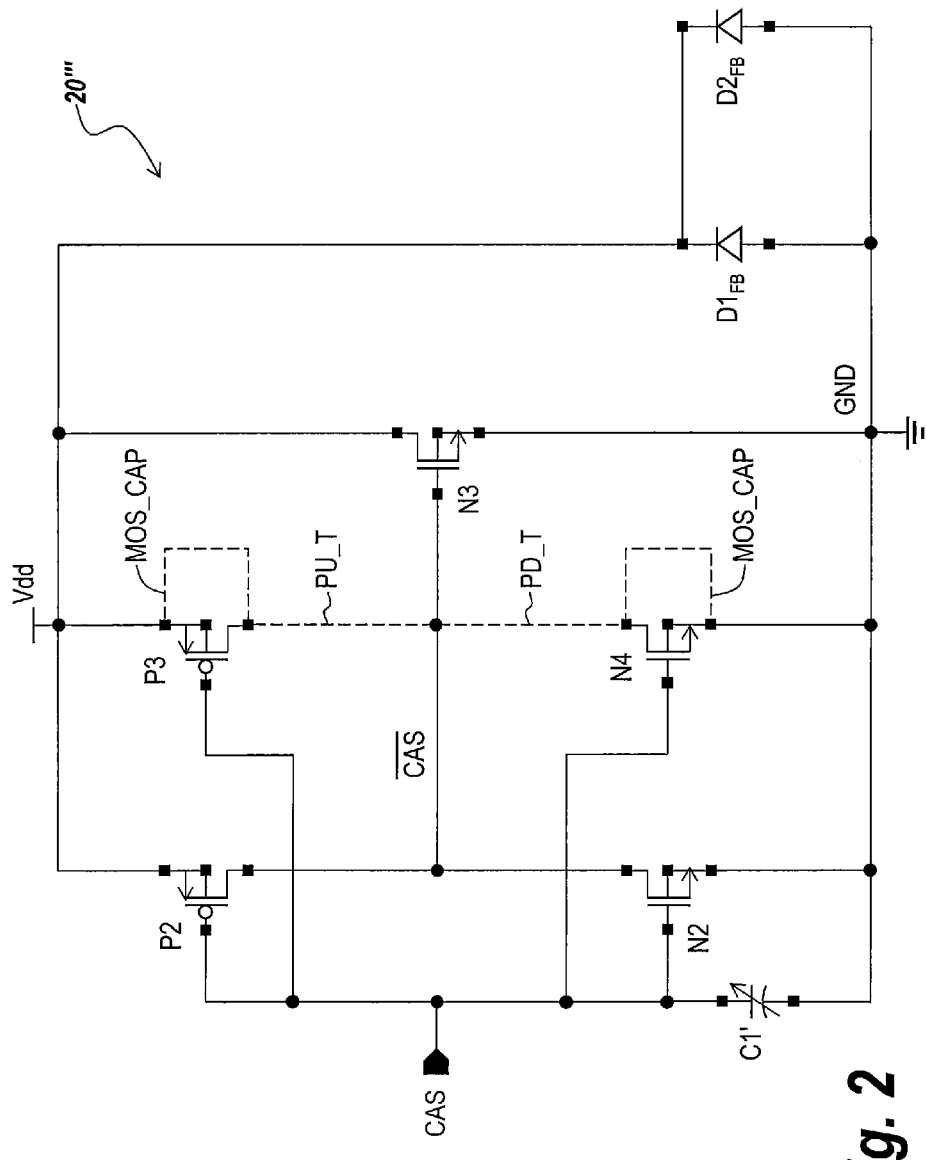
FIG. 2 is an electrical schematic of a voltage clamping circuit with built-in transient suppression, according to an embodiment of the present invention.

Referring now to FIG. 2, an additional embodiment of a voltage clamping circuit 20''' is illustrated as including an inverter (P2, N2) having an input terminal responsive to the clamp activation signal (CAS) and an output terminal directly connected to a gate terminal of a rail-to-rail NMOS pull-down transistor N3. However, in contrast to the voltage clamping circuit 20'' of FIG. 1C, a transient suppression function can be performed by a variable input capacitor C1' (optional) and possibly further performed by a pair of MOS capacitors P3, N4 (MOS_CAP), which are connected between the input terminal of the inverter (P2, N2) and the first and second signal lines (e.g., Vdd, GND), respectively, as illustrated. In some embodiments of the invention, the PMOS device P3 and NMOS device N4 may be reconfigured as functional pull-up and pull-down transistors (see, e.g., dotted lines PU_T, PD_T), which are connected in parallel with P2 and N2, respectively, to thereby facilitate the tuning of the static and dynamic response of the clamping circuit 20'''. In addition, a pair of parallel diodes $D1_{FB}$, $D2_{FB}$ (optional) may be included to provide a conduction path for reverse current in the event the second signal line voltage rises above the first signal line voltage.

Referring now to FIG. 3, a packaged integrated circuit 30 may be provided, which includes the integrated circuit substrates 200 (or 200') therein. As described hereinabove, these substrates can include the overvoltage protection circuits 100a, 100b, or 100c and logic circuits thereon. This packaged integrated circuit 30 is illustrated as including a sealed integrated circuit package 32 with electrical conductors/pins/TSVs 36 extending therethrough. As will be understood by those skilled in the art, these electrical conductors 36 may be electrically coupled by solder balls 34 to an underlying integrated circuit board (not shown).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An overvoltage protection circuit, comprising:
   an overvoltage detection circuit having a first and second terminals electrically coupled to first and second signal lines, respectively, said overvoltage detection circuit configured to generate a clamp activation signal in response to detecting an excessive overvoltage between the first and second signal lines; and
   a voltage clamping circuit electrically coupled to an output of said overvoltage detection circuit and the first signal line, said voltage clamping circuit configured to turn on and sink current from the first signal line in-sync with a transition of the clamp activation signal from a first logic state to a second logic state and turn off in-sync with a transition of the clamp activation signal from the second logic state to the first logic state.

2. The overvoltage protection circuit of claim 1, wherein said overvoltage detection circuit campuses a totem-pole arrangement of a plurality of serially-connected diodes.

3. An overvoltage protection circuit, comprising:
   overvoltage detection circuit having a first and second terminals electrically coupled to first and second signal lines, respectively, said overvoltage detection circuit configured to generate a clamp activation signal in response to detecting an excessive overvoltage between the first and second signal lines; and
   a voltage clamping circuit electrically coupled to an output of said overvoltage detection circuit and the first signal line, said voltage clamping circuit configured to sink current from the first signal line in response to the clamp activation signal;
   wherein said overvoltage detection circuit comprises a totem-pole arrangement of a plurality of serially-connected diodes and at least one resistor; and
   wherein said overvoltage detection circuit comprises an analog-to-digital level detector having an input electrically coupled to a node in the totem-pole arrangement of the plurality of serially-connected diodes and the at least one resistor and an output electrically coupled to an input of said voltage clamping circuit.

4. The overvoltage protection circuit of claim 3, wherein said analog-to-digital level detector comprises an inverter having an input terminal electrically connected to the at least one resistor.

5. The overvoltage protection circuit of claim 4, wherein the input terminal of the inverter is electrically connected to a cathode of one of the plurality of serially-connected diodes.

6. The overvoltage protection circuit of claim 4, wherein said overvoltage detection circuit further comprises a capacitor having a first terminal electrically connected to the input terminal of the inverter and a second terminal electrically coupled to the second signal line.

7. An overvoltage protection circuit, comprising:
   an overvoltage detection circuit having a first and second terminals electrically coupled to first and second signal lines, respectively, said overvoltage detection circuit configured to generate a clamp activation signal in response to detecting an excessive overvoltage between the first and second signal lines; and
   a voltage clamping circuit electrically coupled by a transient suppression resistor to an output of said overvoltage detection circuit and the first signal line, said voltage clamping circuit configured to sink current from the first signal line in response to the clamp activation signal.

8. An integrated circuit device, comprising:
   an integrated circuit substrate; and
   an overvoltage protection circuit on the integrated circuit substrate, said overvoltage protection circuit comprising:
      an overvoltage detection circuit having a first and second terminals electrically coupled to first and second signal lines, respectively, said overvoltage detection circuit configured to generate a clamp activation signal in response to detecting an excessive overvoltage between the first and second signal lines; and
      a voltage clamping circuit electrically coupled to an output of said overvoltage detection circuit and the first signal line, said voltage clamping circuit configured to sink current from the first signal line in-sync with a transition of the clamp activation signal from a first logic state to a second logic state.

9. The integrated circuit device of claim 8, wherein said voltage clamping circuit comprises a plurality of voltage clamping sub-circuits distributed across the integrated circuit substrate.

10. The integrated circuit device of claim 9, wherein the plurality of voltage clamping sub-circuits are responsive to the same clamp activation signal.

11. The integrated circuit device of claim 9, wherein each of the plurality of voltage clamping sub-circuits comprises a respective MOS transistor having a first current carrying terminal electrically coupled to the first signal line.

12. The integrated circuit device of claim 11, wherein each of the plurality of voltage clamping sub-circuits comprises a respective inverter having an input terminal responsive to the clamp activation signal and an output terminal electrically coupled to a gate terminal of a corresponding MOS transistor.

13. The integrated circuit device of claim 12, wherein the MOS transistors are NMOS transistors having respective drain terminals electrically connected to the first signal line and respective source terminals electrically connected to the second signal line.

14. The integrated circuit device of claim 11, wherein each of the plurality of voltage clamping sub-circuits comprises a respective inverter having an input terminal responsive to the clamp activation signal and an output terminal electrically coupled by a transient suppression resistor to a gate terminal of a corresponding MOS transistor.

15. A packaged integrated circuit device, comprising:
an integrated circuit substrate electrically coupled to a plurality of electrical conductors extending, which extend through an integrated circuit package containing the integrated circuit substrate; and
an overvoltage protection circuit on the integrated circuit substrate, said overvoltage protection circuit comprising:
an overvoltage detection circuit having a first and second terminals electrically coupled to first and second power supply conductors extending though the integrated circuit package, respectively, said overvoltage detection circuit configured to generate a clamp activation signal in response to detecting an excessive overvoltage between the first and second power supply conductors; and
a voltage clamping circuit electrically coupled to an output of said overvoltage detection circuit and the first power supply conductor, said voltage clamping circuit configured to sink current from the first power supply conductor in-sync with a transition of the clamp activation signal from a first logic state to a second logic state.

16. The packaged integrated circuit device of claim 15, wherein said voltage clamping circuit comprises a plurality of voltage clamping sub-circuits distributed across the integrated circuit substrate; and wherein the plurality of voltage clamping sub-circuits are responsive to the same clamp activation signal.

17. The packaged integrated circuit device of claim 15, wherein each of the plurality of voltage clamping sub-circuits comprises a respective MOS transistor having a first current carrying terminal electrically coupled to the first power supply conductor.

18. The packaged integrated circuit device of claim 17, wherein each of the plurality of voltage clamping sub-circuits comprises a respective inverter having an input terminal responsive to the clamp activation signal and an output terminal electrically coupled to a gate terminal of a corresponding MOS transistor.

* * * * *